United States Patent [19]

Hiruta et al.

[11] Patent Number: 5,461,197
[45] Date of Patent: Oct. 24, 1995

[54] ELECTRONIC DEVICE HAVING A CHIP WITH AN EXTERNAL BUMP TERMINAL EQUAL OR SMALLER THAN A VIA HOLE ON A BOARD

[75] Inventors: Yoichi Hiruta, Matsudo; Yasuhiro Yamaji, Kawasaki, both of Japan

[73] Assignee: Kabushiki Kaisha Toshiba, Kawasaki, Japan

[21] Appl. No.: 262,337

[22] Filed: Jun. 17, 1994

Related U.S. Application Data

[62] Division of Ser. No. 833,437, Feb. 11, 1992, abandoned.

[30] Foreign Application Priority Data

Feb. 15, 1991 [JP] Japan ................... 3-022337

[51] Int. Cl.$^6$ .................. H01L 23/02; H01L 23/28
[52] U.S. Cl. .................. 174/52.4; 174/52.2; 174/260; 174/264; 257/778; 257/780; 257/787; 257/791; 257/690; 257/788; 361/760; 361/736
[58] Field of Search .................. 257/698–699, 257/737–738, 778–781, 784, 786, 787–789, 791, 690; 174/52.2, 52.3, 52.4, 260, 262–264; 361/752, 760–764, 767, 736, 772–774

[56] References Cited

U.S. PATENT DOCUMENTS

| | | | |
|---|---|---|---|
| 3,512,051 | 5/1970 | Noll | 257/738 |
| 4,641,425 | 2/1987 | Dubuisson et al. | 174/256 |
| 4,654,248 | 3/1987 | Mohammed | 174/256 |
| 4,772,644 | 9/1988 | Itoh et al. | 523/443 |
| 4,825,284 | 4/1989 | Soga et al. | |
| 4,888,450 | 12/1989 | Lando et al. | 174/256 |
| 4,942,207 | 7/1990 | Lee et al. | 525/476 |
| 4,954,877 | 9/1990 | Nakanishi et al. | |
| 5,019,673 | 5/1991 | Juskey et al. | 174/52.2 |
| 5,110,664 | 5/1992 | Nakanishi et al. | 174/256 |

FOREIGN PATENT DOCUMENTS

| | | | |
|---|---|---|---|
| 52-38884 | 3/1977 | Japan | 257/738 |
| 2-189926 | 7/1990 | Japan | 257/737 |

*Primary Examiner*—Bot L. Ledynh
*Attorney, Agent, or Firm*—Foley & Lardner

[57] ABSTRACT

Since an electronic device comprises an electronic component, an external connection terminal electrically connected to the electronic component, and an envelope for sealing the electronic part and having a thickness less than about 0.5 mm, the electronic device is miniaturized even in the case where it is provided with a large number of terminals. Further, since the electronic component is sealed by the envelope, moisture, etc. is not admitted into the electronic component, resulting in high reliability. In addition, since the thickness of the envelope is thin, the external terminal can be shortened. Thus, the inductance or capacitance of this terminal can be reduced.

13 Claims, 9 Drawing Sheets

ELECTRONIC DEVICE HAVING A CHIP WITH AN EXTERNAL BUMP TERMINAL EQUAL OR SMALLER THAN A VIA HOLE ON A BOARD

This application is a division of application Ser. No. 07/833,437, filed Feb. 11, 1992, now abandoned.

BACKGROUND OF THE INVENTION

This invention relates to an electronic device and a method of manufacturing the same, and more particularly, to a package structure of electronic parts.

Electronic parts such as a semiconductor chips, etc. are mounted on a printed wiring board in the state where they are molded by resin or plastic material. For example, an electronic device shown in FIG. 7 is of a structure in which semiconductor chips (although only one is illustrated) are molded by resin 70 with pads of the respective chips 71 being connected to lead portions 73 of a lead frame by means of wires 72. Further, an electronic device shown in FIG. 8 is such that semiconductor chips 81 are hermetically sealed by a ceramic package 85 with pads of the semiconductor chips 81 being connected to a lead frame 82 by means of bonding wires 83. In addition, there is also a packaging by TAB (Tape Automated Bonding) as shown in FIG. 9. In this case, a semiconductor chip 90 is mounted on a printed wiring board in the state where the semiconductor chip 90 provided with bumps 91 formed on their pads are connected to a polyimide film 93 having a pattern comprised of copper formed thereon.

In recent years, there also exists a packaging called chip-on-board (COB). As shown in FIGS. 10(a) and (b), semiconductor chips 102 provided with bumps formed on their pads are formed directly mounted on both surfaces of a board 101 comprised of ceramic or glass epoxy resin, etc. Further, as shown in FIG. 11, there also exists a package structure in which semiconductor chips 112 are mounted on a ceramic board 111 of the multi-wiring layer type. In addition, as shown in FIG. 12, there is also used a packaging structure in which semiconductor chips 122 are mounted on a flexible resin board 121. These packaging structures are described in the following documents and literature:

1) Semiconductor Packaging Technology Handbook, p117 and p142. ed. by Kohshi Nihei, et. al, Kabushiki Kaisha Science Forum, 1986
2) Mounting Technology of Surface Mount Type LSI Package and Improvement in its Reliability, p33. ed. by Kabushik Kaisha Hitachi Seisakusho Semiconductor Branch, Applied Technology Publishing Firm, 1989
3) Microelectronics Packaging Handbook, p368. ed. by Rav R. Tummale and Fuglne J. Rymaszewski, Van Nastrand Reinhold, 1989.

However, such conventional electronic devices have the following problems. It is first pointed out that it takes much time in the process for molding or packaging a semiconductor chip, etc. Meanwhile, in high performance integrated circuits which have been realized by development of recent device technologies, a large number of terminals such as more than 500 pins are required. For this reason, the packages have become large and manufacturing them is becoming difficult. In accordance with packaging by TAB, enlargement of the package is advantageously permitted to be held down to some extent, but the dimension or size of the package is 1.5 to 3 times larger than the semiconductor chip.

To solve such problems, the above-described COB packaging has been devised and trials have begun for its use. However, with this packaging method, for the time period until the semiconductor chip is mounted on a board, the semiconductor chip must be stored in the state where it is not hermetically sealed by any means. For this reason, there was the problem that moisture or dust, etc. may be admitted into the semiconductor chip, resulting in lowered reliability. A further problem is as follows. Generally, after a semiconductor chip is mounted on a board, the surface of the semiconductor chip is molded by potting resin or plastic. However, since there exists a gap between the board and the molded resin, it was similarly unable to prevent moisture from being admitted into the semiconductor chip.

SUMMARY OF THE INVENTION

Accordingly, an object of this invention is to provide an electronic device of a miniaturized package structure and high reliability and a method of manufacturing such an electronic device.

In accordance with this invention, there is provided an electronic device comprising an electronic component or part, an external connection terminal electrically connected to an electrode of the electronic component, and an envelope for sealing the electronic component wherein the thickness of the envelope is less than about 0.5 mm.

Since the electronic component is sealed by the envelope and the thickness thereof is less than about 0.5 mm, even in the case where the electronic component has a large number of terminals, the dimension or size of the electronic device can be held down to that slightly larger than the electronic component. Further, since the electronic component is in the state sealed by the envelope, admission of moisture, etc. is prevented. As a result, high reliability is ensured. In addition, since the thickness of the envelope is thin, the external connection terminal can be shortened. Thus, the inductance or capacitance of the terminal can be reduced.

Also in the case where a semiconductor chip is used as the electronic component a, miniaturized envelope, high reliability and a shortened external terminal can be provided.

In the case where a radiating fin is attached on the semiconductor chip surface, the radiation characteristic or property is improved.

In the case where a bump is used as the external connection terminal, an electronic device can be further miniaturized.

The envelope may be formed by an organic resin. If inorganic material is included in this organic resin, the thermal resistance is lowered, and thus the radiation property is improved.

In the case where a semiconductor chip is mounted on a board, the strength is improved.

In the case where a wiring pattern is formed on this board, it is not necessarily required that the position of the electrode of the semiconductor chip and the position of the envelope be in correspondence with each other. For this reason, even in the case where circuit design is changed, existing semiconductor chips can be used as they are only by changing the wiring pattern of the board.

In the case where the electronic component or semiconductor chips is hermetically sealed by an envelope U-shaped in cross section and a thin plate, a high strength can be provided.

The electronic device of this invention as described above can be manufactured by using a manufacturing method of this invention comprising a first step of forming a bump on the electrode of a semiconductor chip and a second step of coating resin on the surface of a semiconductor chip and solidifying it. Thus, the number of process steps can be reduced and the process time can be shortened.

When resin is coated on the semiconductor chip surface while rotating the semiconductor chip, an envelope of a uniform thickness can be provided.

In the case where a semiconductor chip is hermetically sealed by an envelope U-shaped in cross section and a thin plate, it is possible to prevent the semiconductor chip from being corroded by filling inactive gas into the package. In the case where reducing gas is filled, particularly corrosion of bump can be more effectively prevented.

BRIEF DESCRIPTION OF THE DRAWINGS

FIGS, 1(a) to 1(c) are longitudinal cross sectional views of every process step and showing a package structure of an electronic device and a method of manufacturing it according to a first embodiment of this invention.

FIGS, 2(a) to 2(d) are longitudinal cross sectional views of every process step showing a package structure of an electronic device and a method of manufacturing it according to a second embodiment of this invention.

FIGS, 3(a) to 3(c) are longitudinal cross sectional views of every process step showing a package structure of an electronic device and a method of manufacturing it according to a third embodiment of this invention.

FIGS, 4(a) and 4(b) are longitudinal cross sectional views of every process step showing a package structure of an electronic device and a method of manufacturing it according to a fourth embodiment of this invention.

Figure 5A:
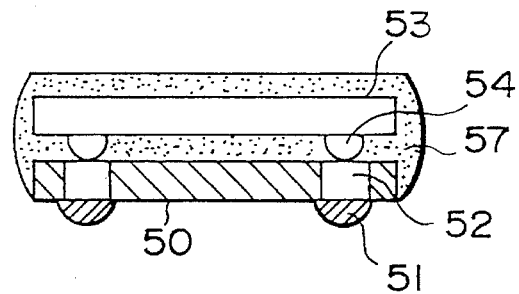
Figure 5B:
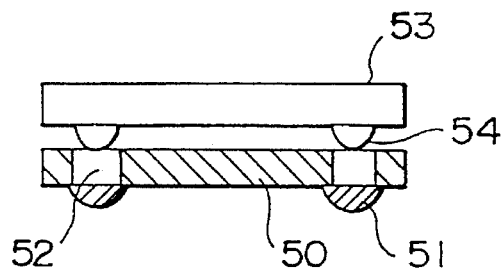
Figure 5C:
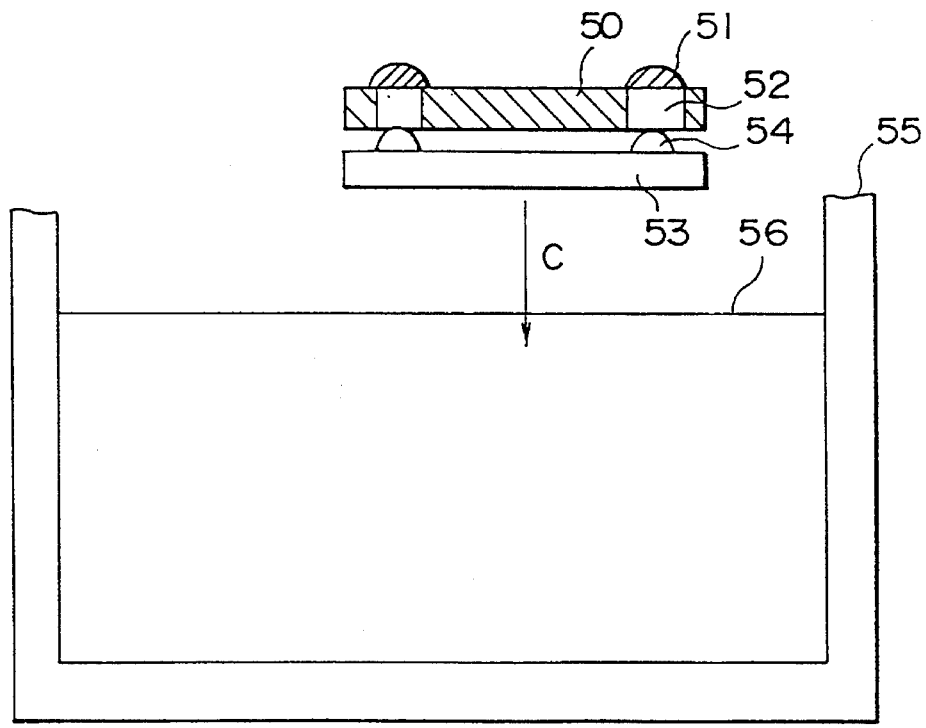

FIGS. 5(a) to 5(c) are longitudinal cross sectional views of every process step showing a package structure of an electronic device and a method of manufacturing it according to a fifth embodiment of this invention.

Figure 6A:
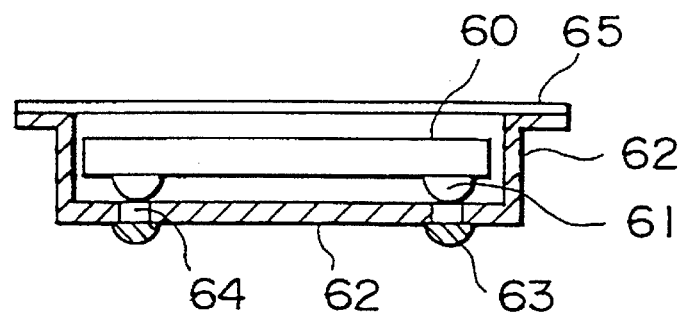
Figure 6B:
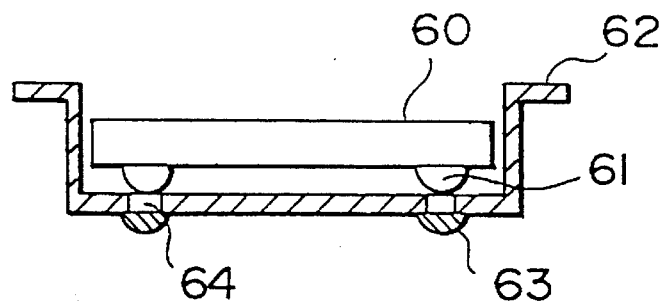
Figure 6C:
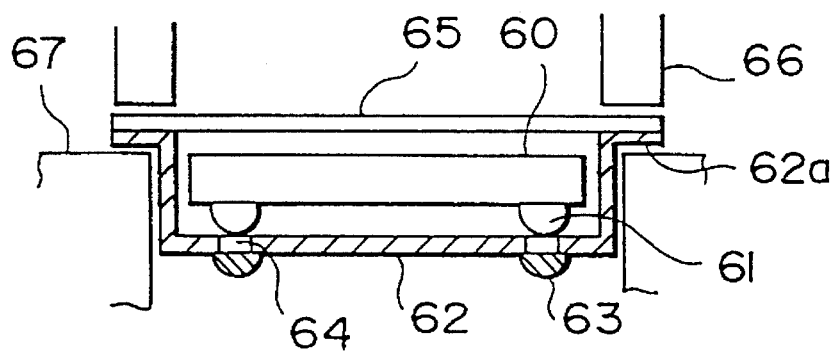
Figure 7:
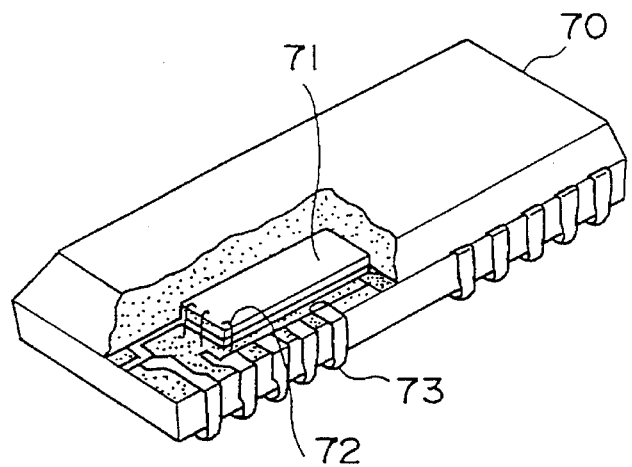

FIGS. 6(a) to 6(c) are longitudinal cross sectional views of every process step showing a package structure of an electronic device and a method of manufacturing it according to a sixth embodiment of this invention.

FIG, 7 is a perspective cross sectional view showing a package structure of a conventional electronic device.

Figure 8:
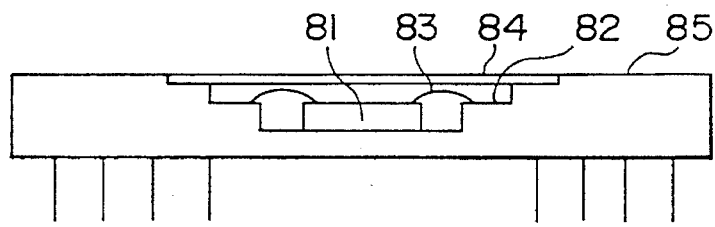
Figure 9:
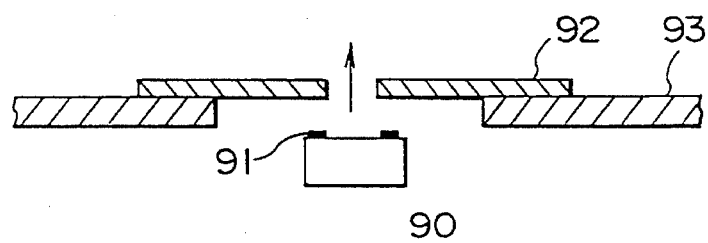

FIG. 8 is a longitudinal cross sectional view showing a package structure of another conventional electronic device.

FIG, 9 is a longitudinal cross sectional view showing a package structure of a further conventional electronic device.

Figure 10A:
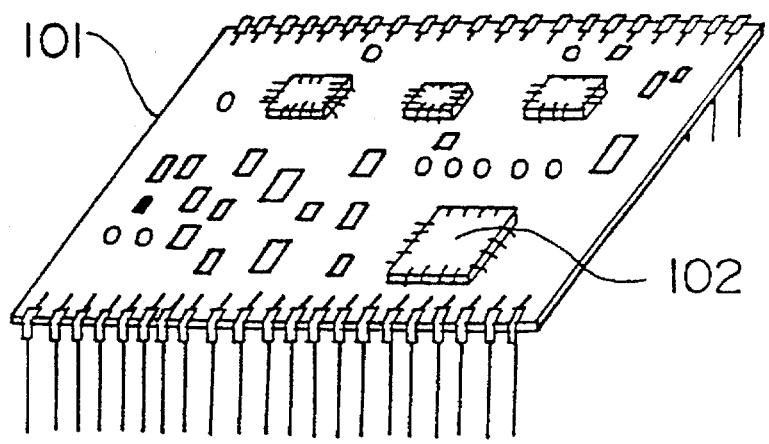
Figure 10B:
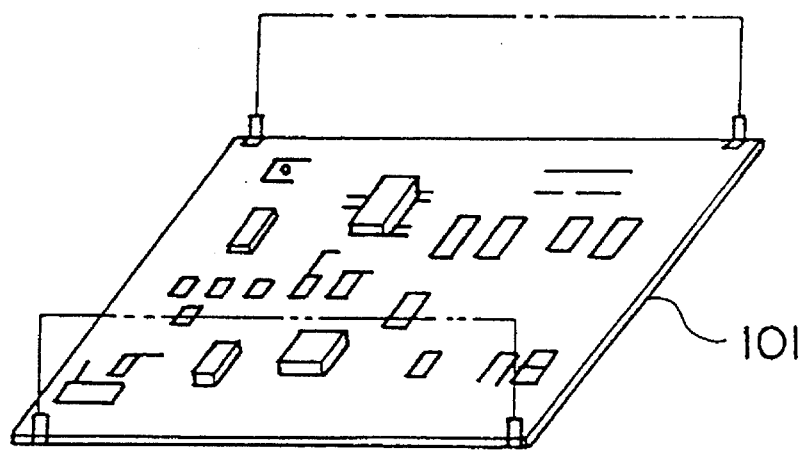

FIGS. 10(a) and 10(b) are perspective views showing package structure of an electronic device according to a conventional COB packaging process.

Figure 11:
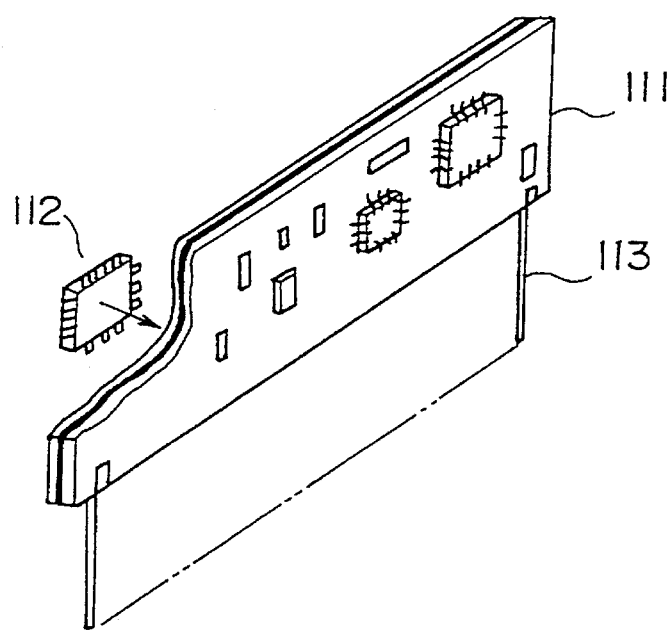

FIG. 11 is a perspective view showing a package structure of an electronic device according to another conventional COB packaging process.

Figure 12:
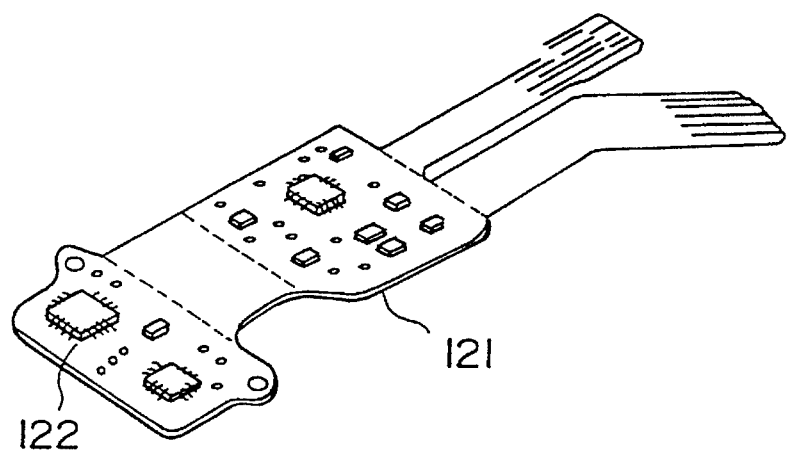

FIG. 12 is a perspective view showing a package structure of an electronic device according to a further conventional COB packaging process.

DESCRIPTION OF THE PREFERRED EMBODIMENTS

Preferred embodiments of this invention will now be described with reference to the attached drawings. An electronic device according to these embodiments is characterized in that it has a package structure in which a semiconductor chip is sealed by an envelope of which the thickness is less than 0.5 mm.

Figure 1A:
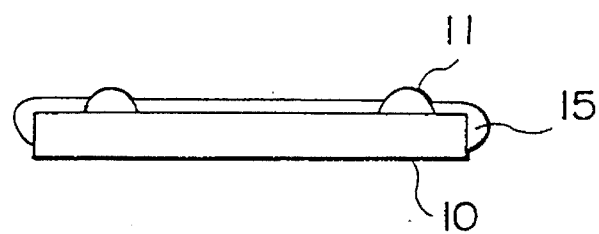

A package structure of an electronic device according to a first embodiment is shown in FIG. 1(a). Bumps 11 are formed on pads of a semiconductor chip 10. The surface of the electronic device is enveloped or covered by an envelope 15 comprised of organic resin.

Figure 1B:
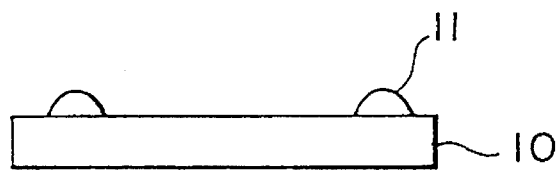
Figure 1C:
Figure 1C:
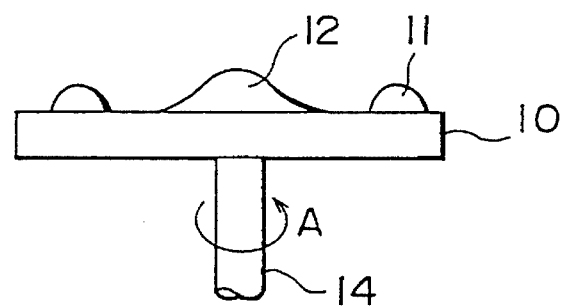

This electronic device is manufactured by the following method. First, as shown in FIG. 1(b), bumps 11 are formed on pads of the semiconductor chip 10 so that they have a height of 70 to 150 um. Thereafter, as shown in FIG. 1(c), the semiconductor chip 10 is mounted on a vacuum chuck 14. By the vacuum chuck 14, the semiconductor chip 10 rotates at a rotation speed of 1000 to 6500 rpm in a direction indicated by an arrow A. As a result, polyimide resin having a viscosity of about 1.5 Pa.S flows out from a nozzle 13, so the semiconductor chip is spin-coated. Thus, an envelope 15 comprised of polyimide resin is formed on the surface of the semiconductor chip 10 so that the thickness thereof is equal to 5 to 50 um.

Here, epoxy resin, silicone resin or polyphenylene sulfide may be used as the envelope 15. Further, if inorganic material such as fused quartz, alumina or aluminum nitride, etc. is included in such organic resin, the thermal resistance is reduced, resulting in improved radiation property.

A second embodiment according to this invention is shown in FIG. 2. In the first embodiment, the surface and the side surfaces of the semiconductor chip were covered by the envelope. On the contrary, in the second embodiment, the entirety of the semiconductor chip 20 including not only the surface on which bumps 21 are formed and the side surfaces of the semiconductor chip 20, but also the back side thereof are molded by an envelope 22.

Figure 2A:
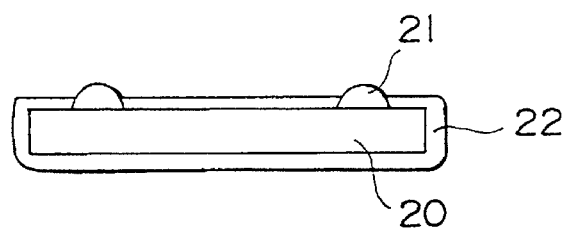
Figure 2B:
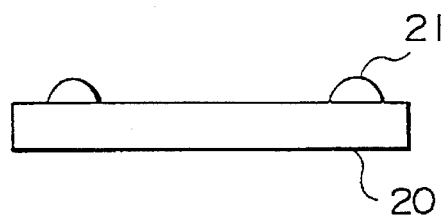
Figure 2C:
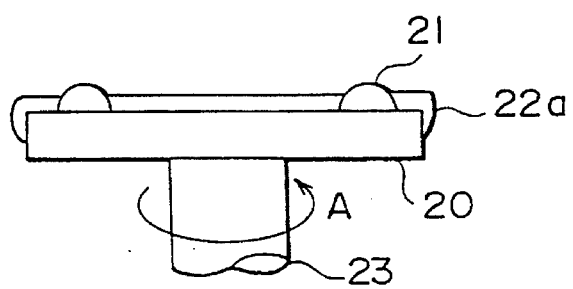
Figure 2D:
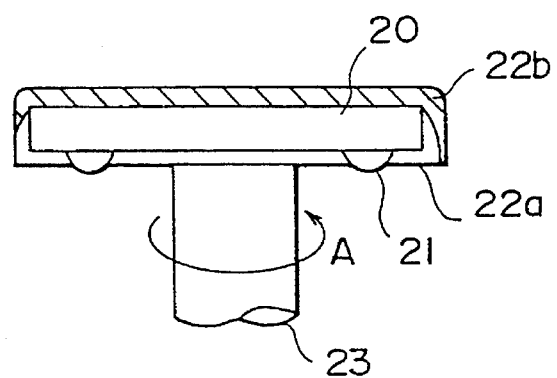

This device is manufactured by the following method. As shown in FIG. 2(a), bumps 21 are formed on pads of the semiconductor chip 20. Then, as shown in FIG. 2(c), the back side of the semiconductor chip 20 is fixed by a vacuum chuck 23, and spin-coat is carried out. Thus, the surface side of the semiconductor chip 20 is molded by resin 22a. Thereafter, as shown in FIG. 2(d), the surface side of the semiconductor chip 20 is fixed by the vacuum chuck 23, and the back side of the semiconductor chip 20 is molded by resin 22b. Thus, by the envelope 22 formed of resin 22a and 22b, the entire surface of the semiconductor chip except for the bumps 21 is molded.

Figure 3A:
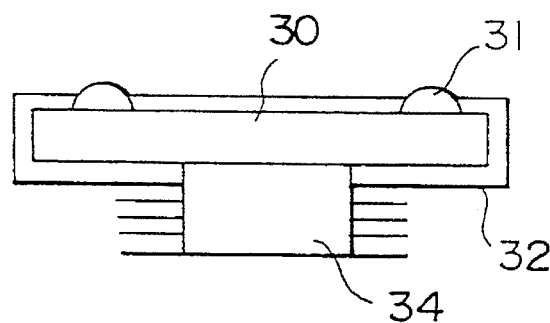

An electronic device according to a third embodiment of this invention is provided with a radiation fin 34 as shown in FIG. 3. In this structure, there exists a portion which is not covered by resin 32 at the central portion of the back where no bump 31 is formed on the semiconductor chip 30. A radiation fin 34 is attached to this portion. Thus, heat produced from the semiconductor chip 30 is radiated.

Figure 3B:
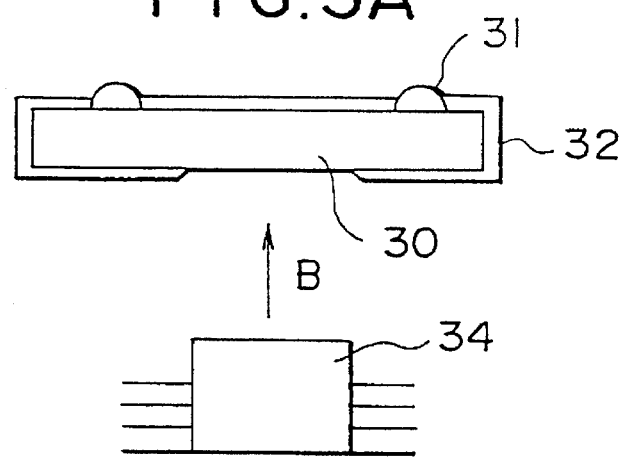
Figure 3C:
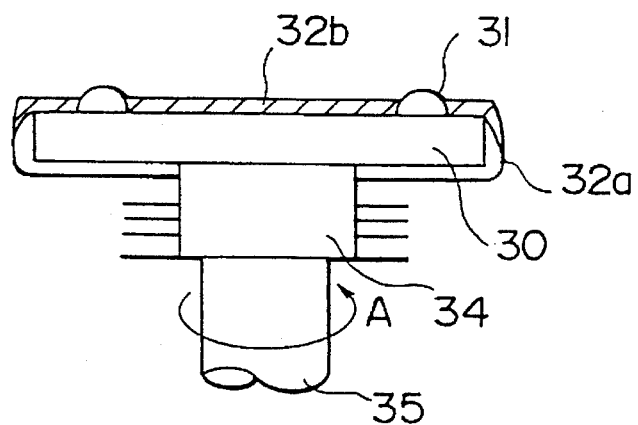

In this embodiment, an electronic device can be manufactured by covering the entire surface except for bumps 31 of the semiconductor chip 30, with resin 32 thereafter to remove the central portion on the back side of the semiconductor chip 31 and attach the radiation fin 34 in a direction indicated by an arrow B by means of Au—Ge solder or polyimide adhesive agent (FIG. 3(b)). Alternatively, as shown in FIG. 3(c), an approach may be employed to attach a radiation fin 35 on the back side of the semiconductor chip 30 thereafter to carry out spin-coating to cover the entirety of the semiconductor chip 31 with resin 32a and 32b.

Figure 4A:
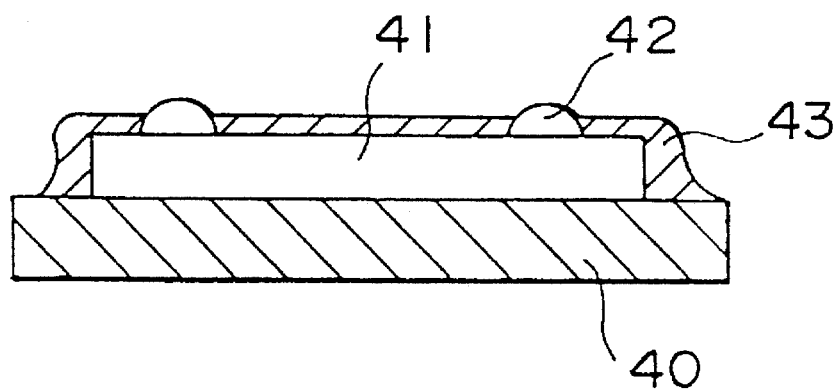

The structure of a device according to a fourth embodiment of this invention is shown in FIG. 4(a). In this embodiment, a semiconductor chip 41 is bonded or connected on a board 40. Thus, strength of the device is improved. For the material of the board 40, organic material, metal such as, aluminum (Al), or iron (Fe), etc., or ceramic such as aluminum oxide ($Al_2O_3$), or aluminum nitride (AlN), etc., may be used. The surface of the semiconductor chip 41 bonded to the board 40 is covered and molded by potting resin 43.

Figure 4B:
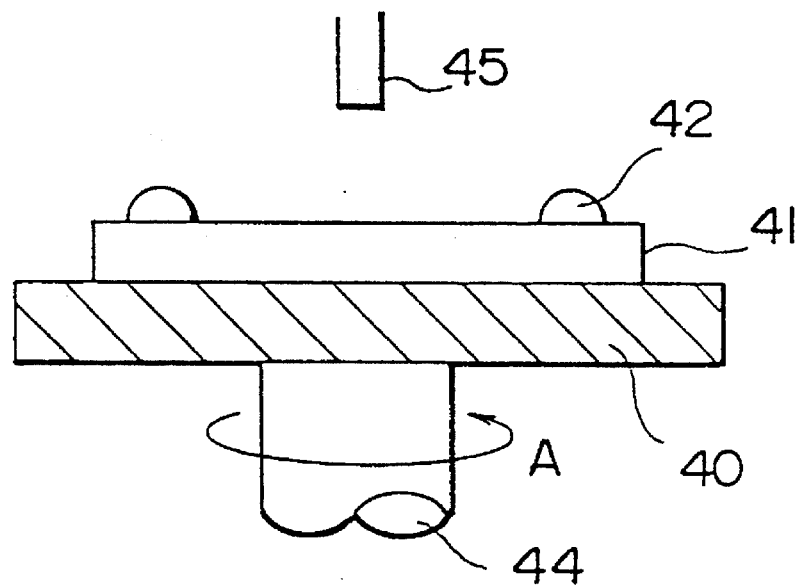

A manufacturing method in this embodiment is as follows. As shown in FIG. 4(b), semiconductor chip 41 is bonded on board 40 by means of an adhesive agent of polyimide system, and the board 40 is fixed by a vacuum chuck 44. In this state, potting resin flows out from nozzle 45. Thus, the Surface side of the semiconductor chip 41 is covered.

Here, the board 40 may have the same dimension of that of the semiconductor chip 41. However, as shown in FIG. 4, when the board 40 has a dimension slightly larger than that of the semiconductor chip 41, the semiconductor chip 41 can be more securely sealed or molded by resin 43.

A package structure of a device according to a fifth embodiment of this invention is shown in FIG. 5(a). On the surface of a board 50, connection pads 51 are formed. Holes 52 are opened at these portions. A semiconductor chip 53 is mounted on a board 50 so that the position of bumps 54 of the semiconductor chip 53 and the position of holes 52 of the board 50 are in correspondence with each other. As illustrated in FIG. 5, the holes 52 are equal to or larger in size than the bumps 54 of the semiconductor chip 53. Also, the connection pads 51 are larger than the holes 52. In this state, the semiconductor chip 53 is molded or sealed by an envelope 57 formed of potting resin.

A method of manufacturing this device is as follows. As shown in FIG. 5(b), the surface side of the semiconductor chip 53 is first mounted on the side where no bump 51 is formed of the board 50. In this state, the semiconductor chip 53 is placed in a vessel in a direction indicated by an arrow C, and resin 56 is coated on the semiconductor chip 53. For this resin 56, resin having low viscosity of about 1.0 Pa.S may be used. In the case of the COB packaging, it is difficult to use such a resin having low viscosity. However, in this embodiment, since resin is coated on the semiconductor chip 53 in the state where the semiconductor chip 53 is not mounted on the printed wiring board, resin of low viscosity can be used. Thus, secure molding or sealing can be carried out without gaps.

A sixth embodiment of this invention is shown in FIG. 6(a). On the surface of an envelope 62 U-shaped in cross section, connection pads 63 are formed, and holes 64 are opened at the positions where the connection pads 63 are formed. On the bottom surface of this envelope 62, a semiconductor chip 60 is mounted so that the position of holes 64 and the position of bumps 61 are in correspondence with each other. A thin plate 65 comprised of metal is pressure-fitted on the upper surface of the envelope 62. Thus, the semiconductor chip 60 is hermetically sealed. For material of this envelope 62, e.g., thermo setting resin or ceramic having thickness of 0.5 mm, etc. may be used. For material of the thin plate 65, aluminum (Al), copper (Cu), iron (Fe), nickel (Ni), or alloy of these materials suitably selected having a thickness of 0.1 mm may be used.

The electronic device according to this embodiment is manufactured as follows. As shown in FIG. 6(b), a semiconductor chip 60 is mounted on the bottom surface of envelope 62. As shown in FIG. 6(c), end portions 62a of the envelope 62 are fixed on supporting portions 67. In this state, pressure is applied to the end portions 62a and the thin plate 65 by means of a pressure-contact tool 66. Thus, the thin plate 65 is pressure fitted on the envelope 62. Here, in the case where inactive gas is filled into an internal space hermetically sealed by the envelope 62 and the thin plate 65, it is possible to prevent a wiring layer, etc. of the semiconductor chip from being corroded. In addition, in the case where reducing gas is used in place of inactive gas, corrosion of bump is more advantageously prevented.

As stated above, the electronic device according to the first to sixth embodiments is characterized in that the semiconductor chip is sealed or molded by the envelope provided with external connection terminals and having a thin thickness is molded or sealed. As previously described, the conventional electronic devices had problems of enlargement of the package size, increase in sealing or molding process time, and/or lowered reliability resulting from the fact that moisture, etc. is admitted into an non-molded or non-sealed semiconductor chip. However, such various problems can be all solved by the first to sixth embodiments of this invention.

In the above-described embodiments, pads of a semiconductor chip are exposed to the surface of the envelope, or pads for external connection are provided at the same positions as those of these pads. For this reason, it is possible to hold down the dimension of the envelope to a dimension slightly than the semiconductor chip. For example, in the case of a ceramic package having 500 pins, the dimension thereof is 5 centimeters square. On the contrary, in accordance with the embodiments of this invention, it is possible to provide a device having a function equivalent to the above with a dimension of 1.5 to 2.0 centimeters square.

Further, in the case where an electronic device is manufactured by the methods according to the embodiments of this invention, such an electronic device can be basically manufactured through the process step of forming bumps on pads of a semiconductor chip and the process step of sealing by resin. Accordingly, the process time can be shortened.

In the conventional COB packaging, while it is possible to hold down an increase of the dimension because the semiconductor chip is directly mounted on a board, there was the problem that moisture is admitted into the semiconductor chip, resulting in reduced reliability. On the contrary, in accordance with the embodiments of this invention, since the semiconductor chip is molded or sealed, high reliability can be ensured.

Furthermore, in these embodiments, since the thickness of the envelope for sealing a semiconductor chip is thin, the length of the terminal can be shortened to a higher degree than that of the conventional package. As a result, inductance or capacitance of leads is reduced. Thus, high speed operation can be performed.

In addition, in the fifth embodiment shown in FIG. 5, by forming a circuit pattern on the printed wiring board 50, it is possible to form bumps 51 at positions different from those of pads of the semiconductor chip 54 on the board 50. Thus, even in the case where there occurs a need for change of design, an existing semiconductor chip 53 can be used as it is only by changing the arrangement of bumps provided on the board 50. The cost can therefore be reduced.

It should be noted that the above-described embodiments are all considered to be illustrative, and do not limit therefore this invention. For example, while the semiconductor chip is sealed or molded in the embodiments, electronic parts such as transistor or resistor, etc. may be sealed or molded.

What is claimed is:

1. An electronic device comprising:

a semiconductor chip having an external bump terminal;

a board having a via hole whose position corresponds to that of the external bump terminal of said semiconductor chip, a size of the via hole being equal to or larger than the external bump terminal of the semiconductor chip, the board also having an external bump terminal on one surface of said board, a size of the external bump terminal of said board being larger than the size of the via hole, said board mounting said semiconductor chip thereon in a state that the external bump terminal of said board is connected to the external bump terminal of said semiconductor chip through the via hole; and an envelope for sealing at least a gap between said semiconductor chip and said board.

2. The electronic device as set forth in claim 1, wherein a material of said envelope is selected from organic resin, epoxy resin, silicone resin or polyphenylene sulfide.

3. The electronic device as set forth in claim 1, wherein said envelope has a thickness of 5 to 50 μm.

4. The electronic device as set forth in claim 1, wherein the bump terminal of said semiconductor chip has a height of 70 to 150 μm.

5. The electronic device as set forth in claim 1, wherein said board has at least one wiring layer thereon.

6. The electronic device as set forth in claim 1, wherein said envelope is formed of resin having a viscosity of approximately 1.0 Pa.S.

7. The electronic device as set forth in claim 1, wherein said envelope is formed of resin including at least one of fused quartz, alumina or aluminum nitride.

8. An electronic device comprising:

a semiconductor chip having an external bump terminal;

a board having a via hole, a size of the via hole being equal to or larger than the external bump terminal of the semiconductor chip, the board further having a wiring pattern for an internal connection between the external bump terminal of said semiconductor chip and the via hole of said board and an external bump terminal on one surface of said board, a size of the external bump terminal of said board being larger than the size of the via hole, said board mounting said semiconductor chip thereon in a state that the external bump terminal of said board is connected to the external bump terminal of said semiconductor chip through the via hole and the wiring pattern; and an envelope for sealing at least a gap between said semiconductor chip and said board.

9. The electronic device as set forth in claim 8, wherein a material of said envelope is selected from organic resin, epoxy resin, silicone resin or polyphenylene sulfide.

10. The electronic device as set forth in claim 8, wherein said envelope has a thickness of 5 to 50 μm.

11. The electronic device as set forth in claim 8, wherein the bump terminal of said semiconductor chip has a height of 70 to 150 μm.

12. The electronic device as set forth in claim 8, wherein said envelope is formed of resin having a viscosity of approximately 1.0 Pa.S.

13. The electronic device as set forth in claim 8, wherein said envelope is formed of resin including at least one of fused quartz, alumina or aluminum nitride.

* * * * *